(12) United States Patent
Ning et al.

(10) Patent No.: US 10,777,761 B2
(45) Date of Patent: Sep. 15, 2020

(54) POLYMER SOLAR CELL

(71) Applicants: Tsinghua University, Beijing (CN); HON HAI PRECISION INDUSTRY CO., LTD., New Taipei (TW)

(72) Inventors: Wen Ning, Beijing (CN); Peng Liu, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 104 days.

(21) Appl. No.: 16/155,896

(22) Filed: Oct. 10, 2018

(65) Prior Publication Data

US 2019/0319205 A1 Oct. 17, 2019

(30) Foreign Application Priority Data

Apr. 16, 2018 (CN) .......................... 2018 1 0337311

(51) Int. Cl.
*H01L 51/42* (2006.01)
*H01L 51/44* (2006.01)
*H01L 51/00* (2006.01)

(52) U.S. Cl.
CPC ...... *H01L 51/4273* (2013.01); *H01L 51/0003* (2013.01); *H01L 51/0034* (2013.01); *H01L 51/0048* (2013.01); *H01L 51/441* (2013.01)

(58) Field of Classification Search
CPC ............. H01L 51/4273; H01L 51/0003; H01L 51/0034; H01L 51/0048; H01L 51/441
See application file for complete search history.

(56) References Cited

U.S. PATENT DOCUMENTS

| 2007/0047056 | A1* | 3/2007 | Kempa | ........... H01L 31/035227 |
| | | | | 359/245 |
| 2008/0245409 | A1* | 10/2008 | Varghese | ............ H01L 31/0735 |
| | | | | 136/256 |
| 2011/0220191 | A1* | 9/2011 | Flood | ..................... B82Y 30/00 |
| | | | | 136/255 |
| 2017/0365418 | A1 | 12/2017 | Schumann et al. | |

FOREIGN PATENT DOCUMENTS

| CN | 102646745 | 8/2012 |
| TW | 201624738 | 7/2016 |

\* cited by examiner

*Primary Examiner* — Jayne L Mershon
(74) *Attorney, Agent, or Firm* — ScienBiziP, P.C.

(57) ABSTRACT

A polymer solar cell includes an anode electrode, a photoactive layer, and a cathode electrode stacked on each other in that order. The photoactive layer includes a polymer layer and a plurality of carbon nanotubes dispersed in the polymer layer. Each of the plurality of carbon nanotubes includes a first carbon nanotube portion and a second carbon nanotube portion. The first carbon nanotube portion is embedded in the polymer layer, and the second carbon nanotube portion is exposed out of the polymer layer and directly contacts the cathode electrode.

12 Claims, 12 Drawing Sheets

POLYMER SOLAR CELL

CROSS-REFERENCE TO RELATED APPLICATIONS

This application is related to commonly-assigned applications entitled, "POLYMER SOLAR CELL", concurrently filed Ser. No. 16/155,900; "METHOD FOR MAKING POLYMER SOLAR CELL", concurrently filed Ser. No. 16/155,894; "METHOD FOR MAKING POLYMER SOLAR CELL", concurrently filed Ser. No. 16/155,897; "POLYMER SOLAR CELL", concurrently filed Ser. No. 16/155,898; "METHOD FOR MAKING POLYMER SOLAR CELL", concurrently filed Ser. No. 16/155,899. Ser. Nos. 16/155,900 and 16/155,894 share the same specification, Ser. Nos. 16/155,896 and 16/155,897 share the same specification, and Ser. Nos. 16/155,898 and 16/155,899 share the same specification. Disclosures of the above-identified applications are incorporated herein by reference.

FIELD

The present application relates to polymer solar cells and methods for making the same.

BACKGROUND

The polymer solar cell has many advantages such as wide raw materials and low cost, and has become one of the research hotspots in recent years. When the light reaches the photoactive layer of the polymer solar cell, the photoactive layer absorbs photons of the light and generates excitons. The excitons diffuse and reach the interface between the donor and the acceptor to form electrons and holes. The electrons pass through the acceptor and reach the cathode electrode, and the holes pass through the donor and reach the anode electrode. Thus, a potential difference between the cathode electrode and the anode electrode is formed. The use of solar light is an important factor to affect the photoelectric conversion efficiency of the polymer solar cell. A common method is to increase the solar light absorption rate by changing the material of the photoactive layer.

Al-Haik et al. (US20070110977A1) discloses that a plurality of carbon nanotubes are dispersed in a polymer and then these carbon nanotubes are oriented using a magnetic field, to form a composite. The composite can be acted as a photoactive material of the polymer solar cell. However, the carbon nanotubes are covered with the polymer, and the carbon nanotubes do not directly contact with the electrodes, thereby reducing the electrical conductivity between the carbon nanotubes and the electrodes.

Therefore, there is room for improvement in the art.

BRIEF DESCRIPTION OF THE DRAWINGS

Implementations of the present technology will now be described, by way of example only, with reference to the attached figures, wherein.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to illustrate details and features better. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Depending on the embodiment, certain of the steps or blocks described may be removed, others may be added, and the sequence of steps or blocks may be altered. It is also to be understood that the description and the claims drawn to a method may include some reference numeral indication referring to certain blocks or steps. However, the reference numeral indication used is only for identification purposes and not interpreted as a suggestion as to an order for the steps.

Figure 1:
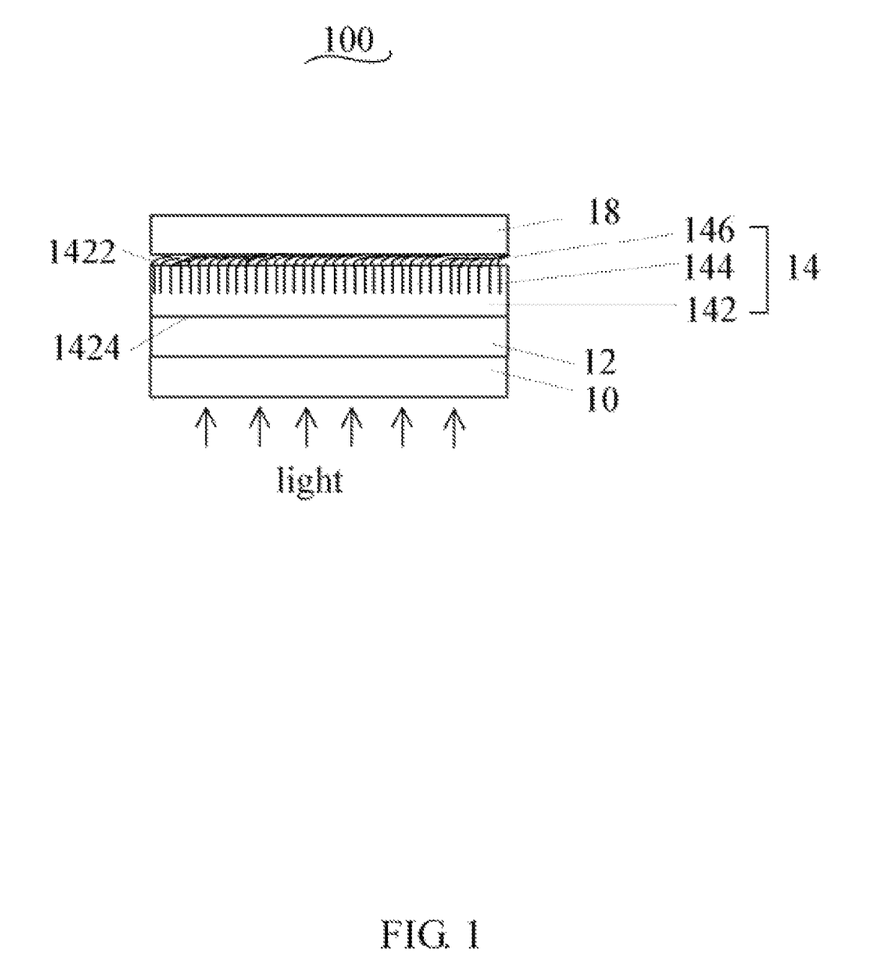
FIG. 1 schematically shows a first embodiment of a polymer solar cell.

FIG. 1 shows a polymer solar cell 100 of a first embodiment and that includes a support 10, an anode electrode 12, a photoactive layer 14, and a cathode electrode 18. The support 10, the anode electrode 12, the photoactive layer 14, and the cathode electrode 18 are stacked on each other in that order. The photoactive layer 14 includes a polymer layer 142 and a plurality of carbon nanotubes 144 dispersed in the polymer layer 142. A portion of each carbon nanotube 144 is exposed from the polymer layer 142 and directly contacts the cathode electrode 18. In one embodiment, the photoactive layer 14 consists of the polymer layer 142 and the plurality of carbon nanotubes 144. Furthermore, the support 10 can be omitted, because the photoactive layer 14 is a free-standing structure.

The support 10 can be transparent or opaque. The material of the support 10 can be glass, quartz, transparent plastic or resin. The material of the support 10 can also be silicon. The anode electrode 12 and the cathode electrode 18 can be a transparent conductive layer or a porous mesh structure, such as ITO (indium tin oxide) layer, FTO (F-doped tin oxide) layer, or the like. The anode electrode 12 and the cathode electrode 18 can be opaque, such as aluminum layer, silver layer, or the like. When the cathode electrode 18 are transparent, the support 10 and the anode electrode 12 can be transparent or opaque. When the cathode electrode 18 are opaque, the support 10 and the anode electrode 12 are transparent. In one embodiment, light is irradiated to the photoactive layer 14 through the support 10 and the anode electrode 12, the support 10 is a glass plate, the material of the anode electrode 12 is ITO, and the material of the cathode electrode 18 is aluminum.

The polymer layer 142 functions as an electron donor. The polymer layer 142 has a first polymer surface 1422 and a second polymer surface 1424 opposite to the first polymer surface 1422. The first polymer surface 1422 is closed to the cathode electrode 18, and the second polymer surface 1424 directly contacts the anode electrode 12. The material of the polymer layer 142 can be polythiophene and its derivative, polyfluorene and its derivative, poly-phenylene vinylene and its derivative, polypyrrole and its derivative, or any combination thereof. The polythiophene derivative can be poly(3-hexylthiophene) ($P_3HT$). The polyfluorene derivative can be poly(dioctylfluorene). The poly-phenylene vinylene derivative can be poly[2-methoxy-5-(2-ethyl-hexyloxy)-1,4-phenylene vinylene]. In one embodiment, the material of the polymer layer 142 is polythiophene.

Figure 2:
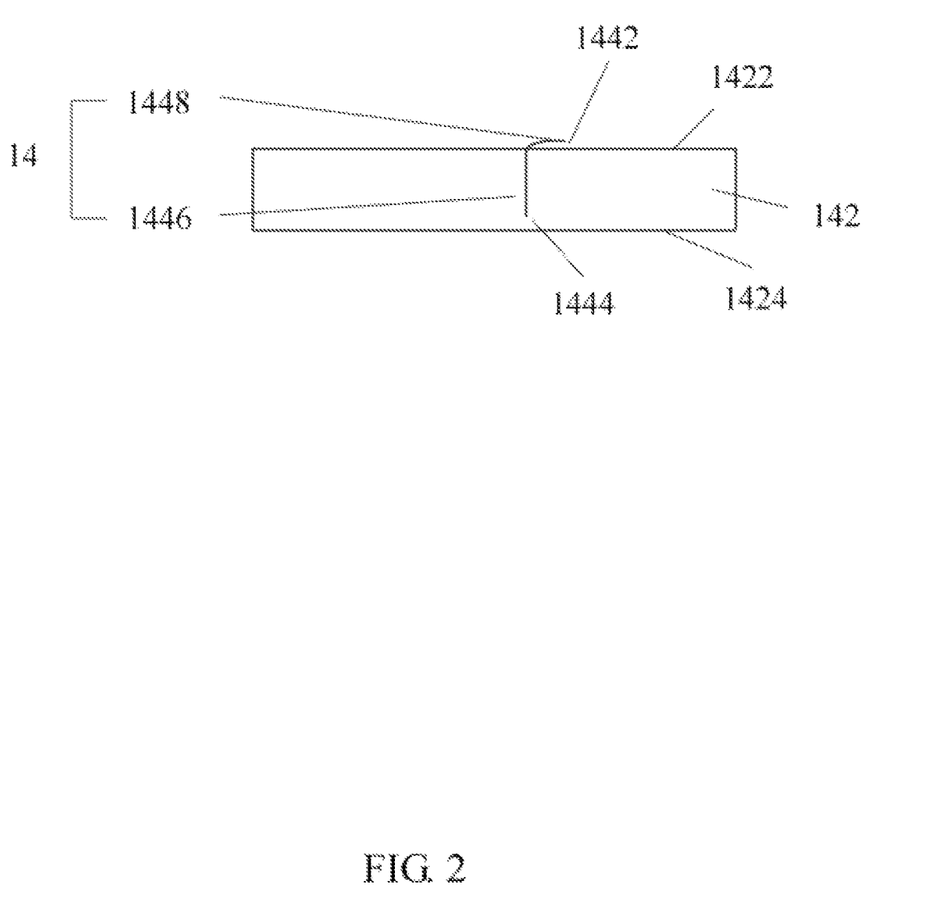
FIG. 2 schematically shows a first embodiment of one carbon nanotube in a polymer layer.

The plurality of carbon nanotubes 144 functions as electron acceptors. Referring to FIG. 2, each carbon nanotube 144 consists of a first carbon nanotube portion 1446 and a second carbon nanotube portion 1448. The first carbon nanotube portions 1446 of the plurality of carbon nanotubes 144 are dispersed in the polymer layer 142, and substantially parallel to and spaced apart from each other. The lengths of the first carbon nanotube portions 1446 of the plurality of carbon nanotubes 144 substantially extend along the same direction. The length direction of the first carbon nanotube portion 1446 is perpendicular to the first polymer surface 1422. The second carbon nanotube portions 1448 of the plurality of carbon nanotubes 144 are exposed from the polymer layer 142 and directly contacts the cathode electrode 18. The second carbon nanotube portions 1448 are connected to each other to form a carbon nanotube layer 146. The carbon nanotube layer 146 is between the polymer layer 142 and the cathode electrode 18. The carbon nanotube layer 146 directly contacts the polymer layer 142 and the cathode electrode 18.

The carbon nanotube layer 146 is composed of a uniformly distributed plurality of second carbon nanotube portions 1448. The plurality of second carbon nanotube portions 1448 are overlapped and connected to each other by van der Waals force. An angle $\beta$ is defined between the plurality of second carbon nanotube portions 1448 and the first polymer surface 1422, and $0° \leq \beta \leq 60°$. In one embodiment, $0° \leq \beta \leq 15°$. In one embodiment, the plurality of second carbon nanotube portions 1448 lay on the first polymer surface 1422, and the length directions of the plurality of second carbon nanotube portions 1448 are parallel to the first polymer surface 1422. The length directions of the plurality of second carbon nanotube portions 1448 can be parallel to each other. Alternatively, the length directions of the plurality of second carbon nanotube portions 1448 are not parallel to each other. That is, the plurality of second carbon nanotube portions 1448 can be orderly or disorderly arranged. The term 'disordered carbon nanotube' refers to the plurality of second carbon nanotube portions 1448 are arranged along many different directions, and the aligning directions of the carbon nanotubes are random. The plurality of second carbon nanotube portions 1448 arranged along each different direction can be almost the same (e.g. uniformly disordered). The plurality of second carbon nanotube portions 1448 can be entangled with each other.

Each carbon nanotube 144 has a first end 1442 and a second end 1444 opposite to the first end 1442. The first end 1442 can be located between and directly contacts the first polymer surface 1422 and the cathode electrode 18. The second end 1444 is embedded in the polymer layer 142, and does not directly contact with the anode electrode 12. The first carbon nanotube portions 1446 are embedded in the polymer layer 142 and are not in contact with the anode electrode 12, such that the anode electrode 12 is electrically insulated from the carbon nanotubes 144. Thus, the electrons generated by exciton separation do not migrate from the carbon nanotubes 144 to the anode electrode 12. All of the electrons generated by exciton separation can migrate from the carbon nanotubes 144 to the cathode electrode 18.

The carbon nanotube layer 146 prevents the cathode electrode 18 from directly contacting with the polymer layer 142. Thus, the holes generated by exciton separation do not migrate from the polymer layer 142 to the cathode electrode 18. All of the holes can migrate from the polymer layer 142 to the anode electrode 12. The carbon nanotubes 144 can be single-walled, double-walled, multi-walled carbon nanotubes, or their combinations. The diameter of the single-walled carbon nanotubes 144 are about 0.5 nanometers (nm) to about 50 nm. The diameter of the double-walled carbon nanotubes 144 are about 1.0 nm to about 50 nm. The diameter of the multi-walled carbon nanotubes 144 are about 1.5 nm to about 50 nm. The lengths of the carbon nanotubes 144 are substantially equal.

Figure 3:
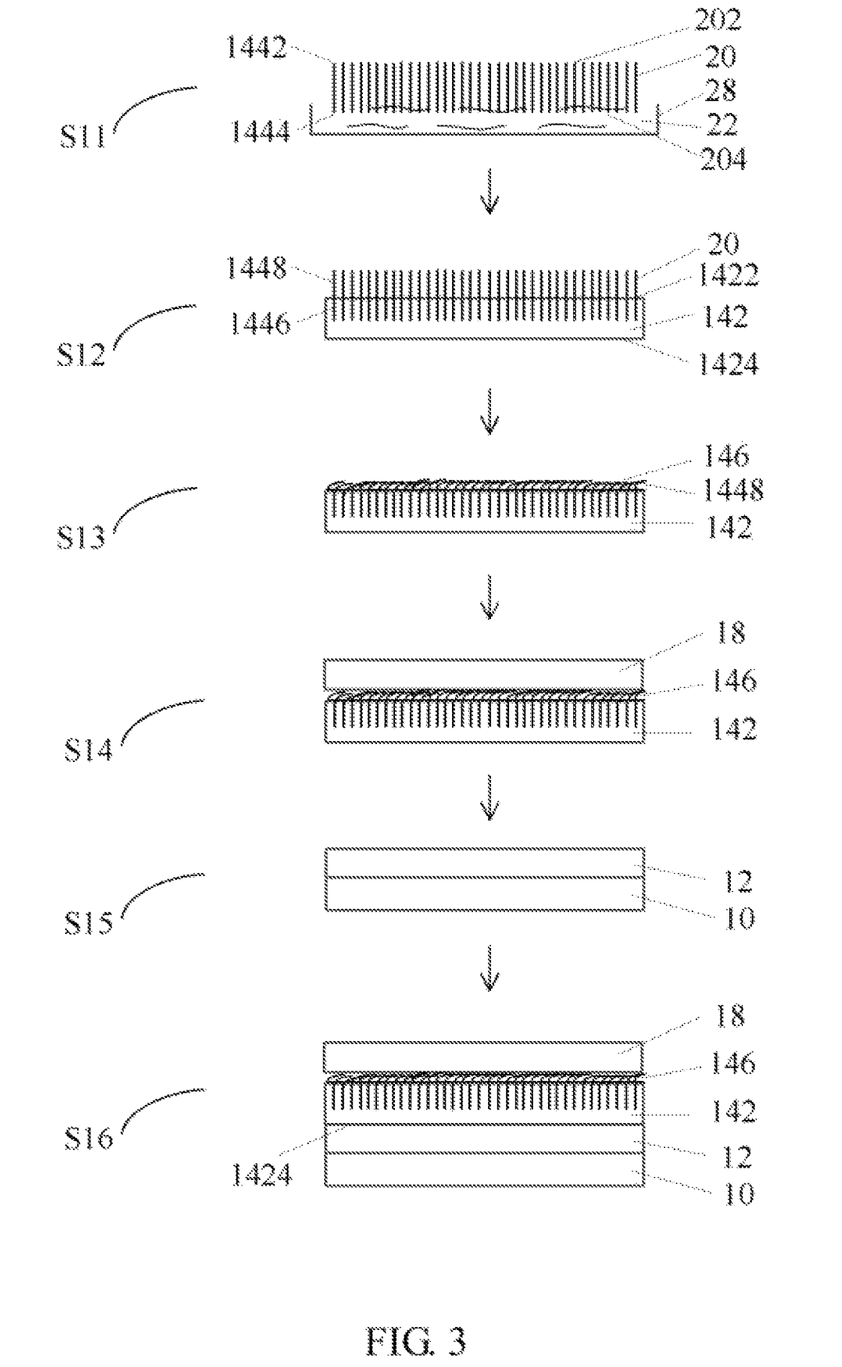
FIG. 3 is a process flow of a method for making the polymer solar cell of FIG. 1.

FIG. 3 shows the first embodiment of a method for making the polymer solar cell 100, and the method includes the following steps:

S11, placing the carbon nanotube array 20 into a polymer solution 22, wherein the carbon nanotube array 20 includes the plurality of carbon nanotubes 144 vertically located in the polymer solution 22, each carbon nanotube 144 has the first end 1442 and the second end 1444 opposite to the first end 1442, the first end 1442 is exposed out of the polymer solution 22, and the second end 1444 is immersed in the polymer layer 142;

S12, curing the polymer solution 22 to form the polymer layer 142, wherein the polymer layer 142 includes the first polymer surface 1422 and the second polymer surface 1424 opposite to the first polymer surface 1422, and the plurality of carbon nanotubes 144 is vertically located in the polymer layer 142; each carbon nanotube 144 consists of the first carbon nanotube portion 1446 and the second carbon nanotube portion 1448, the first carbon nanotube portion 1446 is embedded in the polymer layer 142, the second carbon nanotube portion 1448 is exposed out of the polymer layer 142, and the length direction of the first carbon nanotube portion 1446 and the length direction of the second carbon nanotube portion 1448 are perpendicular to the first polymer surface 1422; and the first end 1442 is exposed out of the polymer layer 142, and the second end 1444 is embedded in the polymer layer 142;

S13, tilting the second carbon nanotube portions 1448 that are originally perpendicular to the first polymer surface 1422, and making the second carbon nanotube portions 1448 and the first polymer surface 1422 form the angle β (0°≤β≤60°), to form the carbon nanotube layer 146;

S14, forming the cathode electrode 18 on a surface of the carbon nanotube layer 146 away from the polymer layer 142;

S15, forming the anode electrode 12 on the support 10; and S16, locating the second polymer surface 1424 on a surface of the anode electrode 12 away from the support 10.

In the step S11, the carbon nanotube array 20 has a first surface 202 and a second surface 204 opposite to the first surface 202, and the plurality of carbon nanotubes 144 extend from the first surface 202 to the second surface 204. The plurality of carbon nanotubes 144 are substantially parallel to and spaced apart from each other. The first ends 1442 of all of the carbon nanotubes 144 form the first surface 202, and the second ends 1444 of all of the carbon nanotubes 144 form the second surface 204. The length directions of the carbon nanotubes 144 are substantially perpendicular to the first surface 202. In one embodiment, the length directions of the carbon nanotubes 144 are perpendicular to the first surface 202, and the carbon nanotubes 144 are parallel to each other. The lengths of the carbon nanotubes 144 are greater than or equal to 100 nanometers. In one embodiment, the lengths of the carbon nanotubes 144 are several hundred micrometers to several hundred millimeters. In one embodiment, the lengths of the carbon nanotubes 144 are greater than or equal to 100 micrometers and less than or equal to 100 millimeters, such as 100 micrometers, 500 micrometers, 1000 micrometers, or 5 millimeters.

The polymer solution 22 is formed by dispersing a polymer material in an organic solvent. The organic solvent is not limited as long as the polymer can be dissolved in the organic solvent. The method for placing the carbon nanotube array 20 into the polymer solution 22 is not limited. The present specification includes two methods, but is not so limited.

Figure 4:
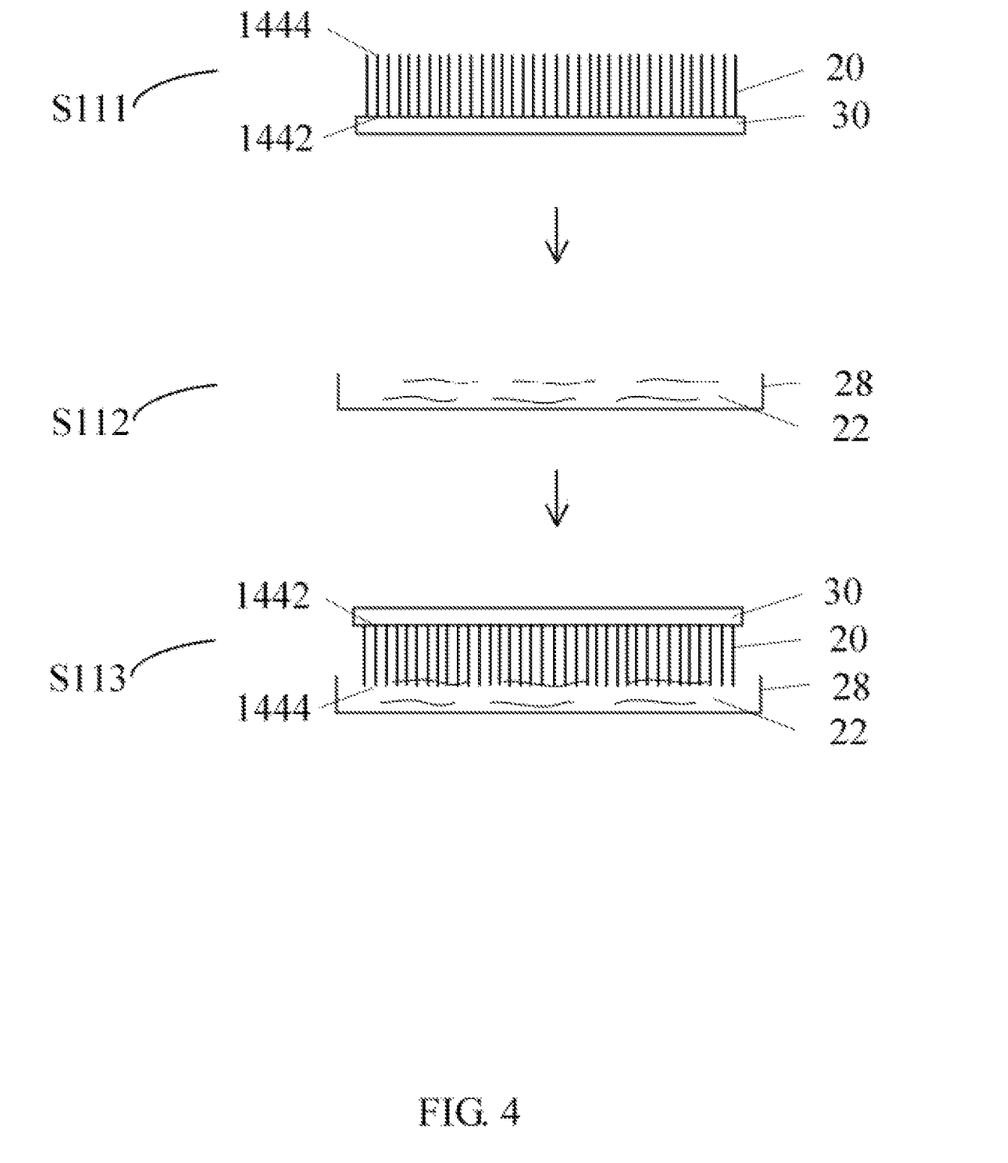
FIG. 4 is a process flow of the first embodiment of a method for placing a carbon nanotube array into a polymer solution.

FIG. 4 shows the first method for placing the carbon nanotube array 20 into the polymer solution 22, and the method includes the following steps:

S111, growing the carbon nanotube array 20 on a growth substrate 30, wherein the first end 1442 of each carbon nanotube 144 directly contacts the growth substrate 30, the second end 1444 of each carbon nanotube 144 is away from the growth substrate 30;

S112, placing the polymer solution 22 in a container 28; and

S113, inverting the growth substrate 30 to make a portion of each carbon nanotube 144 immersed in the polymer solution 22, wherein the second end 1444 is immersed in the polymer solution 22.

In the step S111, the method for making the carbon nanotube array 20 includes the following steps: (a) providing a flat growth substrate 30, wherein the growth substrate 30 can be a P-type silicon wafer, an N-type silicon wafer or a silicon wafer formed with an oxidized layer thereon; and in one embodiment, a 4-inch, P-type silicon wafer is used as the growth substrate 30; (b) forming a catalyst layer on the growth substrate 30, wherein the catalyst layer is made of a material selected from the group consisting of iron (Fe), cobalt (Co), nickel (Ni), and an alloy thereof; (c) annealing the growth substrate 30 with the catalyst layer in air having a temperature from 700° C. to 900° C. for about 30 minutes to about 90 minutes; (d) providing a carbon source gas at high temperature to a furnace for about 5 minutes to about 30 minutes to grow the carbon nanotube array 20 on the growth substrate 30.

In the step S113, the method for inverting the growth substrate 30 and partially immersing the carbon nanotube array 20 into the polymer solution 22 is not limited. For example, the growth substrate 30 can be fixed by a tool, such as tweezers, to invert the growth substrate 30.

When the carbon nanotube array 20 is placed in the polymer solution 22 by the first method, it is necessary to further include a step of removing the growth substrate 30 before the step S13. The method for removing the growth substrate 30 is not limited, for example, the growth substrate 30 is peeled off using a tool, such as a knife, or the growth substrate 30 is etched using a laser.

Figure 5:
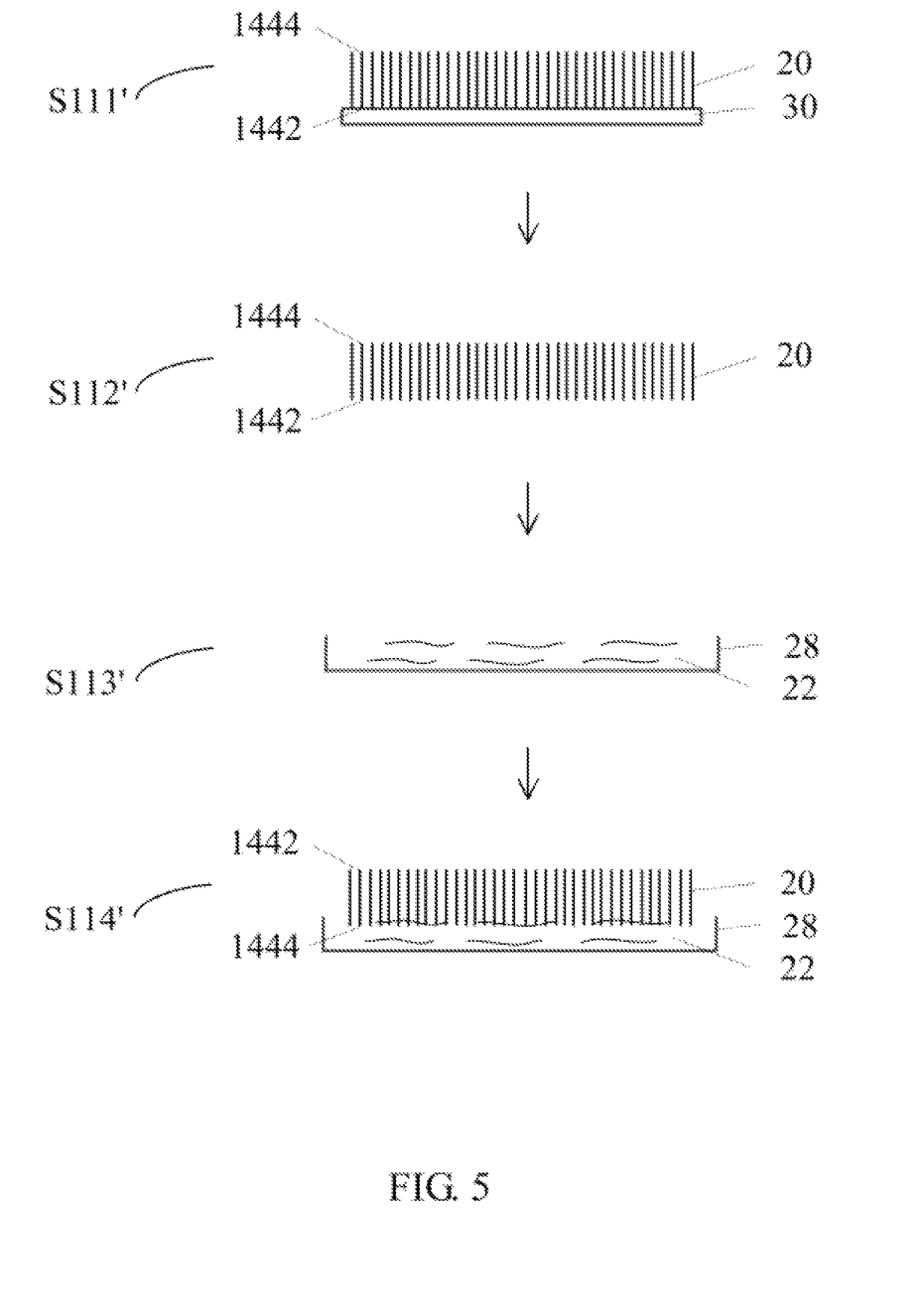
FIG. 5 is a process flow of the first embodiment of another method for placing the carbon nanotube array into the polymer solution.

FIG. 5 shows the second method for placing the carbon nanotube array 20 into the polymer solution 22, and the method includes the following steps:

S111', growing the carbon nanotube array 20 on a growth substrate 30, wherein the first end 1442 of each carbon nanotube 144 directly contacts the growth substrate 30, the second end 1444 of each carbon nanotube 144 is away from the growth substrate 30;

S112', removing the growth substrate 30;

S113', placing the polymer solution 22 in the container 28; and

S114', immersing a portion of each carbon nanotube 144 in the polymer solution 22.

In the step S112', the carbon nanotube array 20 can be totally peeled off from the growth substrate 30. In one embodiment, the carbon nanotube array 20 is totally peeled off from the growth substrate 30 by a knife or other similar tool along a direction parallel to the surface of the growth substrate 30. In the process of peeling off the carbon nanotube array 20, adjacent two of the carbon nanotubes 144 join together by van der Waals attractive force, therefore the carbon nanotube array 20 is free-standing structure. In one embodiment, two tweezers respectively clamp the two opposite sides of the carbon nanotube array 20.

The term "free-standing" includes, but not limited to, the carbon nanotube array 20 that does not have to be supported by a substrate. For example, a free-standing carbon nanotube array 20 can sustain itself when it is hoisted by a portion thereof without any significant damage to its structural integrity. So, if the free-standing carbon nanotube array 20 is placed between two separate substrates, a portion of the free-standing carbon nanotube array 20, not in contact with the two substrates, would be suspended between the two substrates and yet maintain structural integrity.

After curing the polymer solution 22 to form the polymer layer 142 in the step S12 and before combining the polymer layer 142 with the anode electrode 12 in the step S16, a step of removing the container 28 is needed. For example, the whole structure in the container 28 is taken out of the container 28.

In the step S12, the method for curing the polymer solution 22 is not limited, for example, polymer solution 22 is heated to form the polymer layer 142.

In the step S13, the method for tilting the second carbon nanotube portions 1448 is not limited. The present invention provides a method for tilting the second carbon nanotube portions 1448, but this method does not limit the invention.

The method for tilting the second carbon nanotube portions 1448 includes the following steps:

S131, providing a pressing device 40; and

S132, pressing the second carbon nanotube portions 1448 by the pressing device 40.

In the step S131, the pressing device 40 can be a smooth-surfaced pressing head.

In the step S132, in the process of pressing the second carbon nanotube portions 1448, the second carbon nanotube portions 1448 tilt such that the angle $\beta$ ($0° \le \beta \le 60°$) between the second carbon nanotube portions 1448 and the first polymer surface 1422 is formed under the action of pressure. The length directions of the second carbon nanotube portions 1448 that originally perpendicular to the first polymer surface 1422 are changed. In one embodiment, the second carbon nanotube portions 1448 tilt to lay on the first polymer surface 1422 under the action of pressure. The length directions of the second carbon nanotube portions 1448 that originally perpendicular to the first polymer surface 1422 are changed to be parallel to the first polymer surface 1422. When the second carbon nanotube portions 1448 tilt, the second carbon nanotube portions 1448 are still joined to the first carbon nanotube portions 1446, and the carbon nanotubes 144 are not broken by the pressure.

Figure 6:
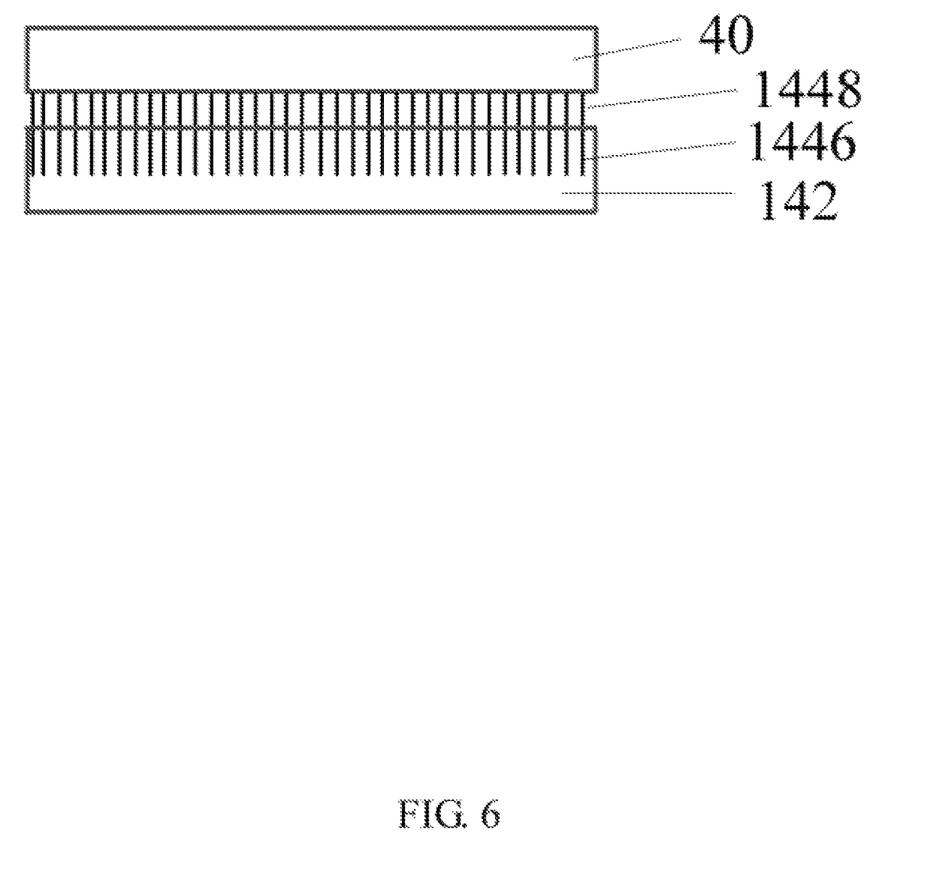
FIG. 6 schematically shows the first embodiment of pressing the carbon nanotube array.
Figure 7:
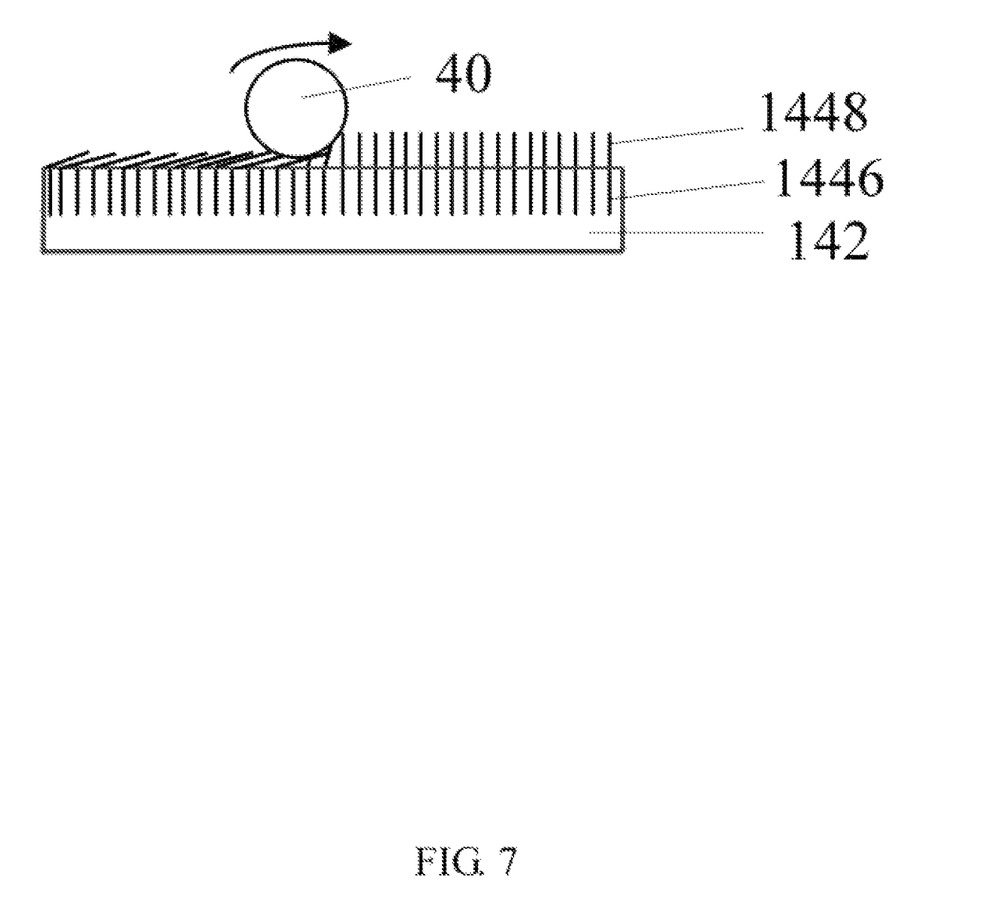
FIG. 7 schematically shows the first embodiment of rolling pressing the carbon nanotube array.
Figure 8:
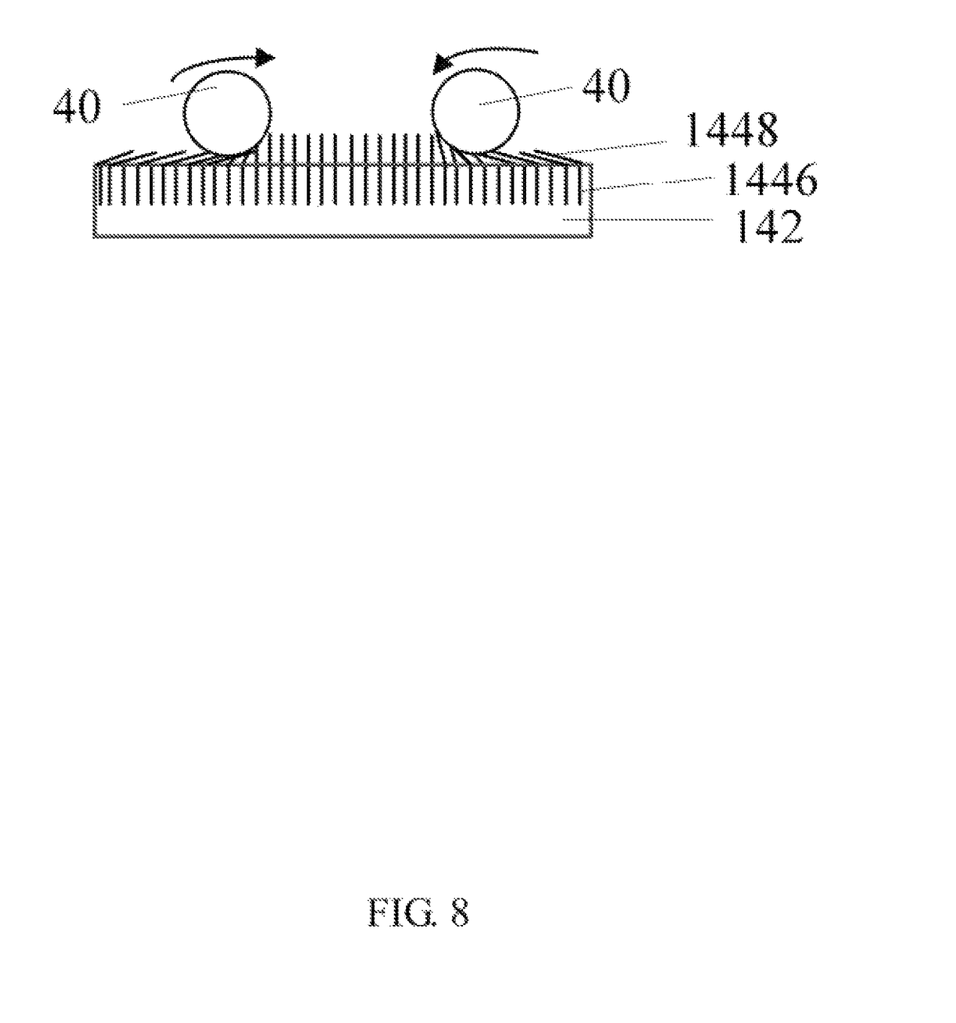
FIG. 8 schematically shows the first embodiment of rolling pressing the carbon nanotube array.

The length directions of the second carbon nanotube portions 1448 are controlled by the shape of the pressing head and the direction of pressing. When the second carbon nanotube portions 1448 are pressed by a planar pressing head along a direction perpendicular to the first polymer surface 1422, the second carbon nanotube portions 1448 randomly bent down and are entangled with each other to form a net-like structure, as shown in FIG. 6. The net-like structure can be isotropic. When the second carbon nanotube portions 1448 are rolling pressed by a roller-shaped pressing head along a fixed direction, the second carbon nanotube portions 1448 tilt along the same direction, as shown in FIG. 7. When the second carbon nanotube portions 1448 are rolling pressed by a roller-shaped pressing head along different directions, the second carbon nanotube portions 1448 tilt along different directions, as shown in FIG. 8. The carbon nanotube layer 146 has a thickness, and the thickness of the carbon nanotube layer 146 can be controlled by the heights of the second carbon nanotube portion 1448 and the pressure.

In the step S14, the method for forming the cathode electrode 18 on the carbon nanotube layer 146 is related to the distribution density of the second carbon nanotube portions 1448 in the carbon nanotube layer 146. When the distribution density of the second carbon nanotube portions 1448 in the carbon nanotube layer 146 is large, such that there is no through hole that can penetrate entire carbon nanotube layer 146, the cathode electrode 18 can formed on the surface of the carbon nanotube layer 146 away from the polymer layer 142 by sputtering, coating, vapor deposition, spraying, or the like. The cathode electrode 18 does not directly contact with the polymer layer 142, because there is no the though hole in the carbon nanotube layer 146 and the material of the cathode electrode 18 does not pass through the carbon nanotube layer 146 to directly contact with the polymer layer 142. When the distribution density of the second carbon nanotube portions 1448 in the carbon nanotube layer 146 is small, such that a gap is formed between two adjacent second carbon nanotube portions 1448, a previously prepared cathode electrode 18, such as a metal film, is placed on the surface of the carbon nanotube layer 146 away from the polymer layer 142.

Under the same pressure, the distribution density of the second carbon nanotube portions 1448 in the carbon nanotube layer 146 is related to the distribution density of the carbon nanotubes 144 in the carbon nanotube array 20. The distribution density of the carbon nanotubes 144 in the carbon nanotube array 20 is larger, and the distribution density of the second carbon nanotube portions 1448 in the carbon nanotube layer 146 is larger. The distribution density of the carbon nanotubes 144 in the carbon nanotube array 20 is smaller, and the distribution density of the second carbon nanotube portions 1448 in the carbon nanotube layer 146 is smaller.

In the step S15, the method for forming the anode electrode 12 on the support 10 is not limited, such as sputtering, coating, vapor deposition, mask etching, spraying, or inkjet printing.

In the step S16, the second polymer surface 1424 of the polymer layer 142 is adhered to the anode electrode 12 by conductive adhesive. Alternatively, the product prepared in the step S14 and the product prepared in the step S15 can be combined to form an integrative structure by hot pressing or cold pressing.

In one embodiment, the hot pressing is used. The product prepared in the step S14 is stacked with the product prepared in the step S15 to form a stacked structure. The stacked structure is placed in a hot pressing device including a metal roll and a heating element. The metal roll is heated by the heating element, and the heating temperature can soften the anode electrode 12 and the polymer layer 142. And then the heated metal roll presses the stacked structure such that a pressure is applied on the stacked structure. During pressing the stacked structure by the heated metal roll, the anode electrode 12 and the polymer layer 142 can be softened and the air in the micropores of the stacked structure can be expelled. Thus, the anode electrode 12 and the polymer layer 142 can be closely pressed together. A rolling speed of the metal roll can be in a range from about 1 millimeter per minute to about 10 meters per minute. The pressure applied by the metal roll can be in a range from about 5 Pa to about 100 Pa. It can be understood that the temperature of the metal roll should be selected so that the anode electrode 12, polymer layer 142, and other functional layers do not melt.

It can be understood that the anode electrode 12 can also be directly formed on the second polymer surface 1424 of the polymer layer 142 by sputtering, coating, evaporation, or the like. And then the support 10 is located on the anode electrode 12 away from the polymer layer 142. Furthermore, the anode electrode 12 is directly formed on the second polymer surface 1424 being free-standing structure. Thus, the support 10 that plays a supporting role can be omitted, and the step of providing the support 10 can also be omitted.

It can be understood that the cathode electrode 18 is formed on the surface of the carbon nanotube layer 146 away from the polymer layer 142 to form a composite structure. Then, the support 10, the anode electrode 12, and the composite structure are sequentially stacked together. The anode electrode 12 is located between the support 10 and the second polymer surface 1424 of the polymer layer 142.

When any one of the anode electrode 12 and the cathode electrode 18 is a metal film, the metal film can reflect light that reaches the metal film into the photoactive layer 14, improving the use of light. Thus, the metal film plays an electric conducting and reflecting light role.

Figure 9:
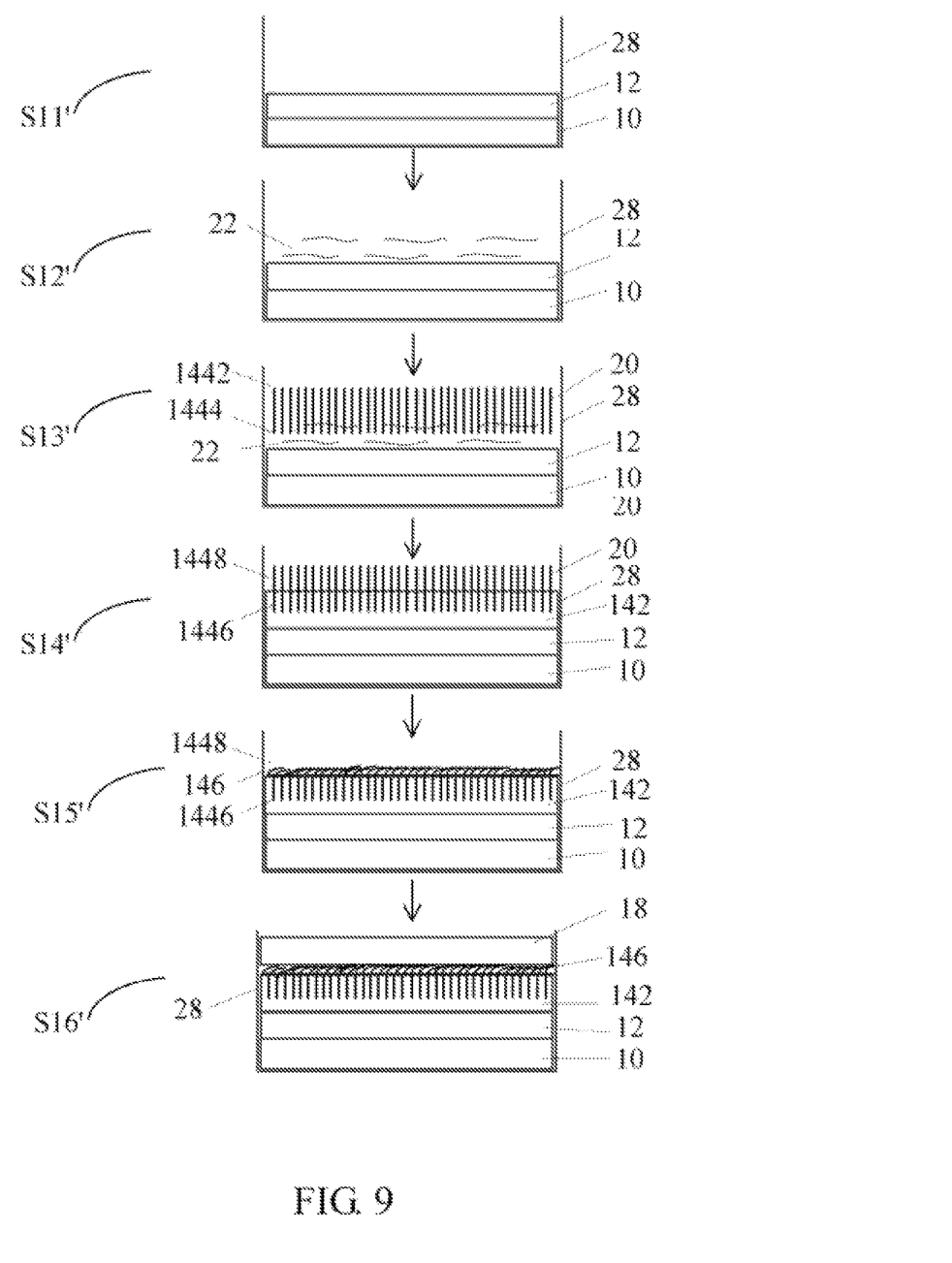
FIG. 9 is a process flow of another method for making the polymer solar cell of FIG. 1.

FIG. 9 shows the first embodiment of another method for making the polymer solar cell 100, and the method includes the following steps:

S11', placing the support 10 in a container 28, wherein the anode electrode 12 is formed on a surface of the support 10 away from the container 28;

S12', placing the polymer solution 22 in the container 28, wherein in one embodiment, the polymer solution 22 is located on a surface of the anode electrode 12 away from the support 10;

S13', locating the carbon nanotube array 20 in the polymer solution 22, wherein the carbon nanotube array 20 includes the plurality of carbon nanotubes 144, each of the plurality of carbon nanotube 144 has the first end 1442 and the second end 1444 opposite to the first end 1442, the first end 1442 is exposed out of the polymer solution 22, and the second end 1444 is immersed in the polymer layer 142;

S14', curing the polymer solution 22 to form the polymer layer 142, wherein the polymer layer 142 includes the first polymer surface 1422 and the second polymer surface 1424 opposite to the first polymer surface 1422, and the plurality of carbon nanotubes 144 is vertically located in the polymer layer; each carbon nanotube 144 consists of the first carbon nanotube portion 1446 and the second carbon nanotube portion 1448, the first carbon nanotube portion 1446 is embedded in the polymer layer 142, the second carbon nanotube portion 1448 is exposed out of the polymer layer 142, and the length direction of the first carbon nanotube portion 1446 and the length direction of the second carbon nanotube portion 1448 are perpendicular to the first polymer surface 1422; and the first end 1442 is exposed out of the polymer layer 142, and the second end 1444 is embedded in the polymer layer 142;

S15', tilting the second carbon nanotube portions 1448 that are originally perpendicular to the first polymer surface 1422, and making the second carbon nanotube portions 1448 and the first polymer surface 1422 form the angle β (0°≤β≤60°), to form the carbon nanotube layer 146; and S16', forming the cathode electrode 18 on a surface of the carbon nanotube layer 146 away from the polymer layer 142.

The method as shown in FIG. 9 is similar to the method as shown in FIG. 3 above except that the support 10 and the anode electrode 12 are located in the container 28, and then the polymer solution 22 is poured into the container 28; and finally the carbon nanotube array 20 and the cathode electrode 18 are formed in that order.

In the step S12', the polymer solution 22 may flow between the support 10 and the sidewall of the container 28, and between the anode electrode 12 and the sidewall of the container 28 along the sidewall of the container 28. After curing the polymer solution 22, the polymer layer 142 can be also present between the support 10 and the sidewall of the container 28, and between the anode electrode 12 and the sidewall of the container 28. After removing the container 28, the polymer layer 142 is on the opposite sides of the support 10 and the anode electrode 12, thereby increasing the bonding force between the support 10, the anode electrode 12, and the polymer layer 142. Alternatively, the polymer layer 142 on the opposite sides of the support 10 and the anode electrode 12 can be removed by etching.

The support 10 in the step S11' can be omitted, and the anode electrode 12 is directly formed at the bottom of the container 28. The container 28 can be removed after forming the cathode electrode 18.

Figure 10:
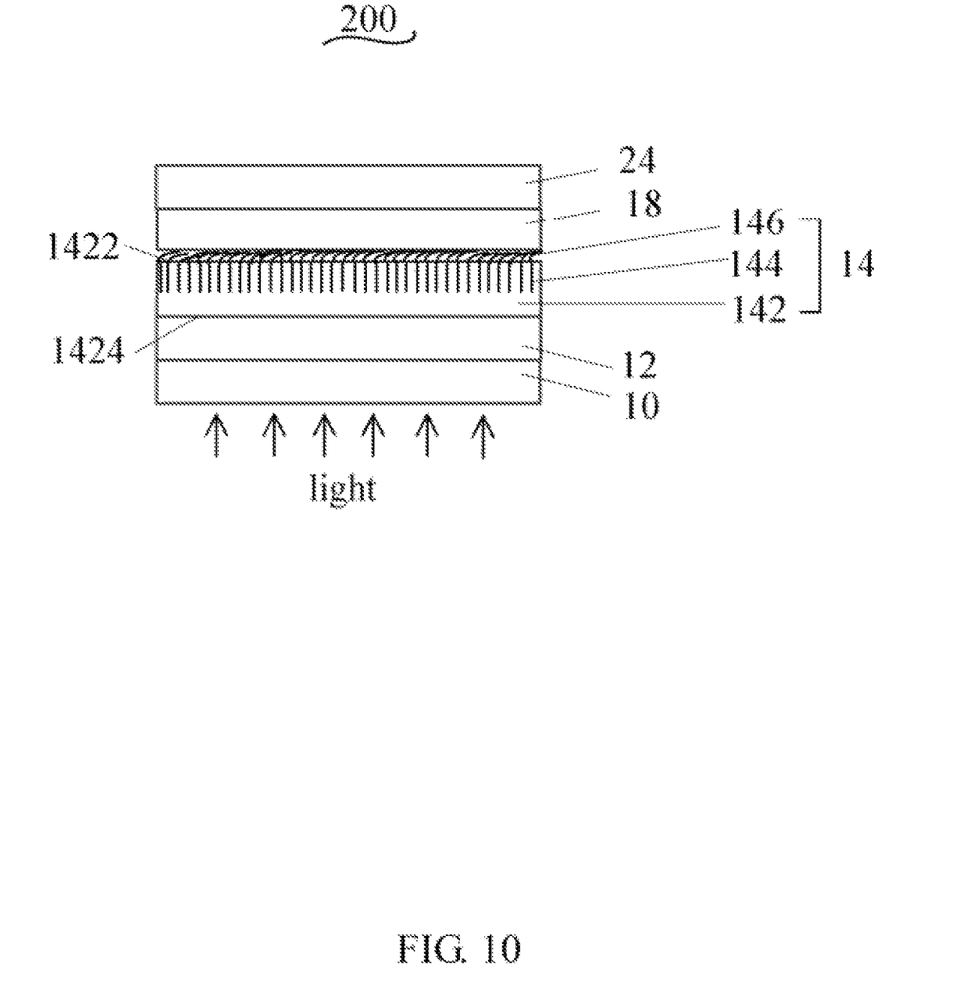
FIG. 10 schematically shows a second embodiment of a polymer solar cell.

FIG. 10 shows a polymer solar cell 200 of a second embodiment. The polymer solar cell 200 of the second embodiment is similar to the polymer solar cell 100 of the first embodiment above except that the polymer solar cell 200 further includes a reflective layer 24 located on the surface of the cathode electrode 18 away from the carbon nanotube layer 146. In the second embodiment, the support 10 is transparent, and the surface of the support 10 away from the anode electrode 12 is the incident surface of light. When the cathode electrode 18 is transparent and the surface of the cathode electrode 18 away from the carbon nanotube layer 146 is the incident surface of light, the reflective layer 24 is located on the surface of the support 10 away from the anode electrode 12.

The function of the reflective layer 24 is: when light reaches the photoactive layer 14 from the transparent support 10, part of the light that reaches the cathode electrode 18 can be reflected back into the photoactive layer 14 from the cathode electrode 18 by the reflective layer 24 located on the surface of the cathode electrode 18 away from the carbon nanotube layer 146. Thus, the use of light is improved. When light reaches the photoactive layer 14 from the cathode electrode 18, part of the light that reaches the support 10 can be reflected back into the photoactive layer 14 from the support 10 by the reflective layer 24 located on the surface of the support 10 away from the anode electrode 12. Thus, the use of light is improved. The material of the photoactive layer 14 has a high reflectivity, and the material can be, but is not limited to, a metal or metal alloy. The metal can be gold, silver, aluminum, or calcium. The metal alloy can be an alloy of calcium and aluminum, an alloy of magnesium and silver, or the like.

In the second embodiment, the method for making the polymer solar cell 200 is provided. The method for making the polymer solar cell 200 in the second embodiment is similar to the method for making the polymer solar cell 100 in the first embodiment above except that the method for making the polymer solar cell 200 further includes a step of forming the reflective layer 24. When the support 10 is transparent, the reflective layer 24 is formed on the surface of the cathode electrode 18 away from the carbon nanotube layer 146 by sputtering, coating, vapor deposition, or the like. When the cathode electrode 18 is transparent, the reflective layer 24 is formed on the surface of the support 10 away from the anode electrode 12 by sputtering, coating, vapor deposition, or the like.

Figure 11:
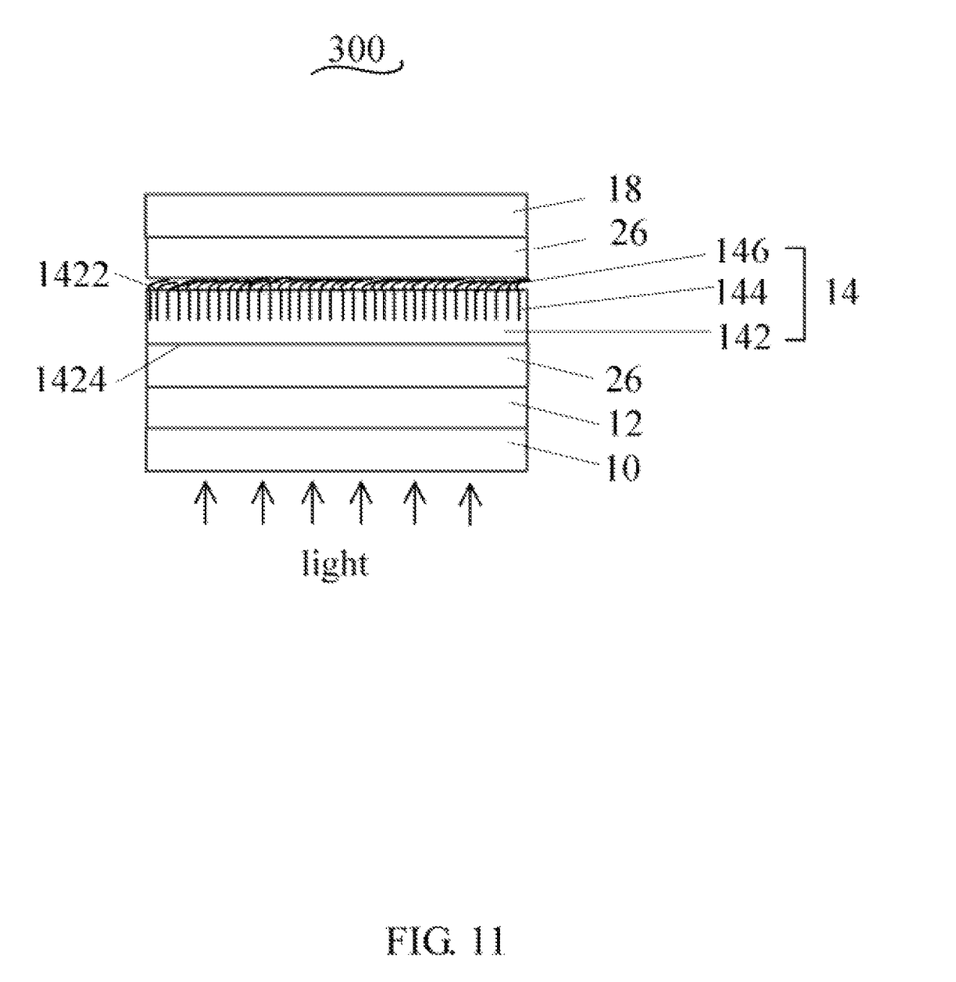
FIG. 11 schematically shows a third embodiment of a polymer solar cell.

FIG. 11 shows a polymer solar cell 300 of a third embodiment. The polymer solar cell 300 of the third embodiment is similar to the polymer solar cell 100 of the first embodiment above except that the polymer solar cell 300 further includes an exciton blocking layer 26. The exciton blocking layer 26 can be located between the photoactive layer 14 and the anode electrode 12. The exciton blocking layer 26 can also be located between the carbon nanotube layer 146 and the cathode electrode 18.

The exciton blocking layer 26 prevents the excitons from diffusing toward the cathode electrode 18 or the anode electrode 12 when light reaches the photoactive layer 14 to form excitons, thereby making all excitons reach the interface between the donor and the acceptor. Thus, the use ratio of the excitons is improved, and accordingly the efficiency of photoelectric conversion of the polymer solar cell 300 is also improved. The material of the exciton blocking layer 26 is organic material, such as $Zn_4O(AID)_6$, $BAlQ_3$, BCP, Bphen, $Alq_3$, TAZ, or TPBI.

In the third embodiment, the method for making the polymer solar cell 300 is provided. The method for making the polymer solar cell 300 in the third embodiment is similar to the method for making the polymer solar cell 100 in the first embodiment above except that the method for making the polymer solar cell 300 further includes a step of forming the exciton blocking layer 26. After the step S13 and before the step S14, the exciton blocking layer 26 is formed on the carbon nanotube layer 146 away from the polymer layer 142 by sputtering, coating, vapor deposition, or the like. Alternatively, before combining the second polymer surface 1424 with the surface of the anode electrode 12 away from the support 10, the exciton blocking layer 26 is formed on the second polymer surface 1424 by sputtering, coating, vapor deposition, or the like.

Figure 12:
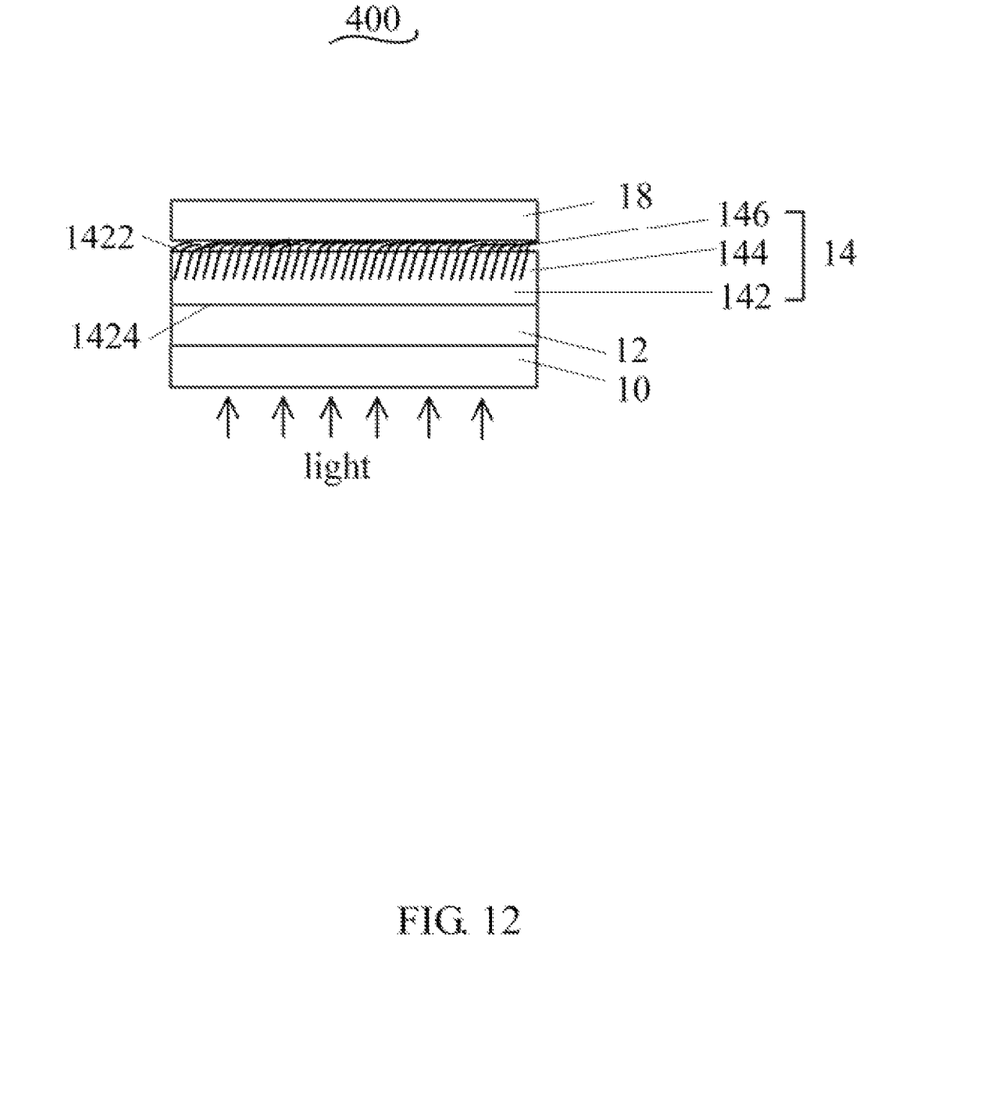
FIG. 12 schematically shows a fourth embodiment of a polymer solar cell.

FIG. 12 shows a polymer solar cell 400 of a fourth embodiment. The polymer solar cell 400 of the fourth embodiment is similar to the polymer solar cell 100 of the first embodiment above except that the arrangement of the carbon nanotubes 144. In the polymer solar cell 100 of the first embodiment, the length directions of the first carbon nanotube portions 1446 are substantially perpendicular to the first polymer surface 1422 of the polymer layer 142. In the polymer solar cell 400 of the fourth embodiment, the length directions of the first carbon nanotube portions 1446 and the first polymer surface 1422 form an angle that is greater than 0 degrees and less than 90 degrees. In one embodiment, the angle is greater than 30 degrees and less than 60 degrees. In one embodiment, the angle is greater than 0 degrees and less than 15 degrees. The advantage of the polymer solar cell 400 is: the first carbon nanotube portions 1446 are tilted in the polymer layer 142, thus the surface of the carbon nanotubes 144 (acceptor) in contact with the polymer layer 142 (donor) is increased. It is beneficial for separating more excitons to form electrons and holes. Thus, the photoelectric conversion efficiency of the polymer solar cell 400 is improved.

In the fourth embodiment, the method for making the polymer solar cell 400 is provided. The method for making the polymer solar cell 400 in the fourth embodiment is similar to the method for making the polymer solar cell 100 in the first embodiment above except that the method for making the polymer solar cell 400 further includes a step of pressing the carbon nanotube array 20 before curing the polymer solution 22. The carbon nanotube array 20 can be pressed by a pressing device 40, such that the carbon nanotubes 144 tilt. The degree of inclination of the carbon nanotubes 144 can be controlled by controlling the pressure, such that the angle of grater than 0 degrees and less than 90 degrees is formed between the first polymer surface 1422 and the first carbon nanotube portions 1446.

The polymer solar cells 100 to 400 have the following advantages: 1) the second carbon nanotube portions 1448 are exposed from the polymer layer 142 and directly contacts the cathode electrode 18, improving the electrical conductivity between the carbon nanotubes 144 and the cathode electrode 18; 2) the carbon nanotubes 144 of the carbon nanotube array 20 are aligned themselves, and it is no longer necessary to orient the carbon nanotubes 144 by external force, such as a magnetic field.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Additionally, it is also to be understood that the above description and the claims drawn to a method may comprise some indication in reference to certain steps. However, the indication used is only to be viewed for identification purposes and not as a suggestion as to an order for the steps.

What is claimed is:

1. A polymer solar cell, comprising:
an anode electrode, a photoactive layer, and a cathode electrode stacked on each other in that order;
wherein the photoactive layer comprises a polymer layer and a plurality of carbon nanotubes dispersed in the polymer layer, each of the plurality of carbon nanotubes comprises a first carbon nanotube portion and a second carbon nanotube portion so that the plurality of carbon nanotubes comprises a plurality of first carbon nanotube portions and a plurality of second carbon nanotube portions, the first carbon nanotube portion is embedded in the polymer layer, the plurality of first carbon nanotube portions is embedded in the polymer layer and in direct contact with the polymer layer, and the second carbon nanotube portion of each of the plurality of carbon nanotubes is exposed out of the polymer layer and directly contacts the cathode electrode; and the polymer layer comprises a first polymer surface and a second polymer surface opposite to the first polymer surface, the second polymer surface is in direct contact with the anode electrode, and the second carbon nanotube portion is exposed from the first polymer surface and lays on the first polymer surface.

2. The polymer solar cell of claim 1, wherein the plurality of first carbon nanotube portions are spaced apart from each other.

3. The polymer solar cell of claim 1, wherein the plurality of first carbon nanotube portions are substantially parallel to each other.

4. The polymer solar cell of claim 1, wherein the polymer layer comprises a first polymer surface, the first polymer surface is away from the anode electrode, and the second carbon nanotube portion is exposed from the first polymer surface and lays on the first polymer surface.

5. The polymer solar cell of claim 4, wherein a length direction of the second carbon nanotube portion is parallel to the first polymer surface.

6. The polymer solar cell of claim 4, wherein the plurality of second carbon nanotube portions and the first polymer surface form an angle $\beta$, and $0° \leq \beta \leq 60°$.

7. The polymer solar cell of claim 1, wherein the polymer layer comprises a first polymer surface, and a length direction of the first carbon nanotube portion is substantially perpendicular to the first polymer surface.

8. The polymer solar cell of claim 1, wherein the plurality of second carbon nanotube portions is connected to each other, to form a carbon nanotube layer located between the polymer layer and the cathode electrode.

9. The polymer solar cell of claim 1, wherein lengths of the plurality of second carbon nanotube portions extend along the same direction.

10. The polymer solar cell of claim 1, wherein lengths of the plurality of second carbon nanotube portions extend along different directions.

11. The polymer solar cell of claim 1, wherein the plurality of second carbon nanotube portions is entangled with each other to form a net-like structure.

12. The polymer solar cell of claim 1, further comprising a reflective layer located on a surface of the cathode electrode away from the polymer layer, on a surface of the substrate away from anode electrode, or on a surface of the anode electrode.

* * * * *